United States Patent
Sucher et al.

(10) Patent No.: US 10,304,721 B1
(45) Date of Patent: May 28, 2019

(54) FORMATION OF ISOLATION LAYERS USING A DRY-WET-DRY OXIDATION TECHNIQUE

(71) Applicant: TEXAS INSTRUMENTS INCORPORATED, Dallas, TX (US)

(72) Inventors: Bradley David Sucher, Murphy, TX (US); Neil L. Gardner, Lowry Crossing, TX (US); Binghua Hu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/859,447

(22) Filed: Dec. 30, 2017

(51) Int. Cl.
| | |
|---|---|
| *H01L 21/762* | (2006.01) |
| *H01L 21/02* | (2006.01) |
| *H01L 21/306* | (2006.01) |
| *H01L 21/8234* | (2006.01) |

(52) U.S. Cl.
CPC .... *H01L 21/76224* (2013.01); *H01L 21/0217* (2013.01); *H01L 21/02164* (2013.01); *H01L 21/02238* (2013.01); *H01L 21/30604* (2013.01); *H01L 21/76205* (2013.01); *H01L 21/823481* (2013.01)

(58) Field of Classification Search
None
See application file for complete search history.

(56) References Cited

U.S. PATENT DOCUMENTS

| | | | | |
|---|---|---|---|---|
| 5,801,083 | A * | 9/1998 | Yu | H01L 21/76232 148/DIG. 161 |
| 2007/0298584 | A1* | 12/2007 | Tokuichi | H01L 21/76229 438/427 |
| 2010/0184295 | A1* | 7/2010 | Sato | H01L 21/3083 438/702 |
| 2013/0153995 | A1* | 6/2013 | Misawa | H01L 29/407 257/330 |
| 2015/0295030 | A1* | 10/2015 | Ahmed | H01L 21/76224 257/520 |
| 2015/0325694 | A1* | 11/2015 | Chan | H03K 17/687 327/434 |
| 2017/0263720 | A1* | 9/2017 | Hirler | H01L 29/66712 |

* cited by examiner

*Primary Examiner* — Mounir S Amer
(74) *Attorney, Agent, or Firm* — Andrew R. Ralston; Charles A. Brill; Frank D. Cimino

(57) ABSTRACT

In some examples, a method includes etching a substrate to form a trench, wherein the trench includes sidewalls. The method further includes forming a first isolation region in the trench by growing a first layer of a first thickness on the sidewalls using a dry oxidation technique and depositing a second layer to fill a portion of the trench, the second layer contacting the first layer. The method further includes etching third and fourth layers atop the substrate to expose a first portion of the substrate. The method further includes growing a second isolation region in the substrate through the first portion by using a dry-wet-dry oxidation technique.

17 Claims, 6 Drawing Sheets

FORMATION OF ISOLATION LAYERS USING A DRY-WET-DRY OXIDATION TECHNIQUE

BACKGROUND

The modern integrated circuit (IC) includes millions of electronic elements (such as transistors) integrated over a common substrate. These electronic elements may be fabricated in regions that are isolated from each other. These isolated regions are sometimes referred to as "active regions."

SUMMARY

In accordance with some examples, a method includes etching a substrate to form a trench, wherein the trench includes sidewalls. The method further includes forming a first isolation region in the trench by growing a first layer of a first thickness on the sidewalls using a dry oxidation technique and depositing a second layer to fill a portion of the trench, the second layer contacting the first layer. The method further includes etching third and fourth layers atop the substrate to expose a first portion of the substrate. The method further includes growing a second isolation region in the substrate through the first portion by using a dry-wet-dry oxidation technique.

In accordance with some examples, a method includes etching a substrate to form a trench, wherein the trench includes sidewalls. The method also includes forming a first isolation region in the trench by growing a first layer of a first thickness on the sidewalls using a first dry-wet-dry oxidation technique and depositing a second layer to fill a portion of the trench, the second layer contacting the first layer. The method further includes etching third and fourth layers atop the substrate to expose a first portion of the substrate. The method also includes growing a second isolation region in the substrate through the first portion by using a second dry-wet-dry oxidation technique.

BRIEF DESCRIPTION OF THE DRAWINGS

For a detailed description of various examples, reference will now be made to the accompanying drawings in which.

DETAILED DESCRIPTION

Figure 1A:
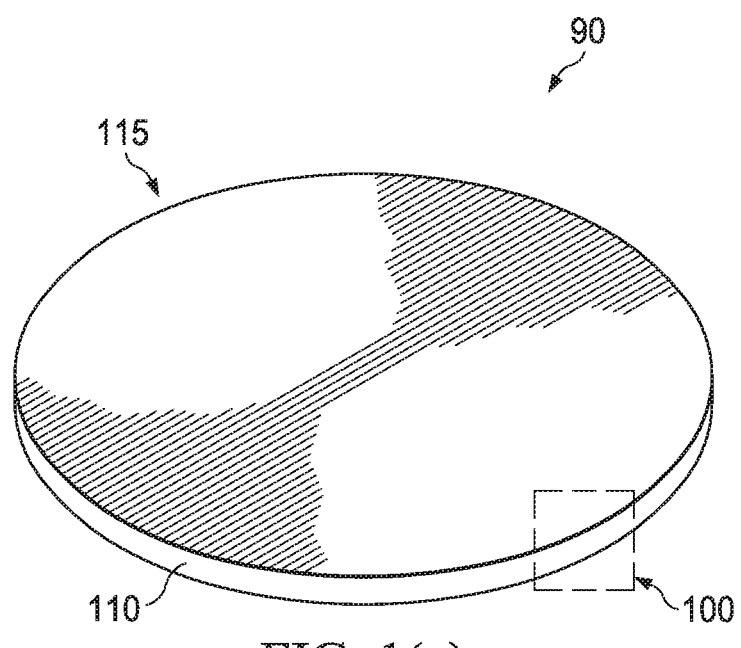
FIG. 1(a) is a perspective view of an illustrative semiconductor wafer, in accordance with various examples.

In some cases, an active region may include an electronic element such as a metal-oxide-semiconductor field-effect transistor (MOSFET), a bitcell, a junction field effect transistor (JFET), etc. In designing an IC with multiple active regions, it is typically assumed that an individual electronic element does not interact with the other electronic elements except through circuit interconnections. Therefore, the circuit designers are motivated to design an IC such that the active regions on the common substrate are electrically isolated from each other.

In some cases, the isolation between active regions may be accomplished by growing a thick dielectric layer (e.g., silicon dioxide) in between the active regions. Growing a dielectric layer, in some cases, may be achieved by local oxidation of silicon ("LOCOS"). In some cases, an isolation region in which LOCOS is performed is referred to as a LOCOS isolation region. In some cases, LOCOS is performed by thermally growing the dielectric (silicon dioxide). Because of the simple thermal oxidation process, using LOCOS may be considered advantageous (e.g., low fabrication costs). Additionally, the LOCOS technique may result in a gradual transition between the isolation region and the electronic elements. However, the LOCOS technique may be limited to the density of components it may pack. Therefore, in some cases, other isolation techniques may be used.

For instance, in some cases, shallow trench isolation (STI) techniques may be employed to isolate active regions. The shallow trench isolation technique includes etching trenches (or troughs) in the substrate between the action regions. The technique further involves filling up the trenches with a dielectric, such as silicon dioxide. Using the STI isolation technique may eliminate the density limitation of the LOCOS isolation technique. The STI isolation technique, due to the use of trenches, may allow physically smaller isolation regions to be formed, which may result in the fabrication of a greater number of electronic elements in a given area, thereby allowing having closely-packed high density electronic components. However, the STI technique may suffer from an abrupt transition from the isolation region to electronic elements (e.g., transition from the isolation region to the gate of the electronic element in the active region.)

In some modern ICs (e.g., advanced analog IC), both the STI and LOCOS isolation techniques may be employed. As noted above, the STI technique may be advantageous for closely-packed, high-density electronic components and the LOCOS isolation technique includes gradual transition between the isolation region and the electronic elements in the active regions. In some cases, to leverage the advantages of both STI and LOCOS isolation techniques, some ICs include both of them. As noted above, a dry oxidation technique is used to fabricate LOCOS regions. However, using dry oxidation technique for the fabrication of both STI and LOCOS regions may bring about additional challenges, such as reduced gate oxide integrity of the electronic elements. Therefore, an oxidation process that can facilitate the use of LOCOS and STI technique in a single IC is desired.

Accordingly, at least some examples disclosed herein are directed to methods for growing a dielectric layer, such as silicon dioxide, using a dry-wet-dry oxidation technique. In particular, the dry-wet-dry oxidation technique is implemented in ICs that employ both STI and LOCOS isolation techniques to isolate active regions. At least some of the examples disclosed herein use the dry-wet-dry oxidation technique to improve (i.e., increase) the gate oxide integrity by improving the quality (e.g., the roundness of the dielectric layer grown in one or more isolation regions) of the dielectric layer that is grown in the isolation regions, which further improves the gate oxide integrity.

FIG. 1(a) is a perspective view of an illustrative semiconductor wafer 90 used to manufacture integrated circuits. The wafer 90 may comprise any suitable compound (e.g., silicon, gallium arsenide and indium phosphide). The wafer 90 includes a substrate 110. Although the following discussion may assume wafers including silicon substrate, the techniques described herein may apply to wafers including other elements/compounds (e.g., elements from column IV of the periodic table of elements as well as combinations of elements from columns III-V). Isolation techniques disclosed further may be performed on a front side 115 of the wafer 90 to form the active regions (not expressly depicted in FIG. 1(a)) in which the electronic elements may eventually be fabricated. Portion 100 of the wafer 90 is now described in context of FIG. 1(b).

Figure 1B:
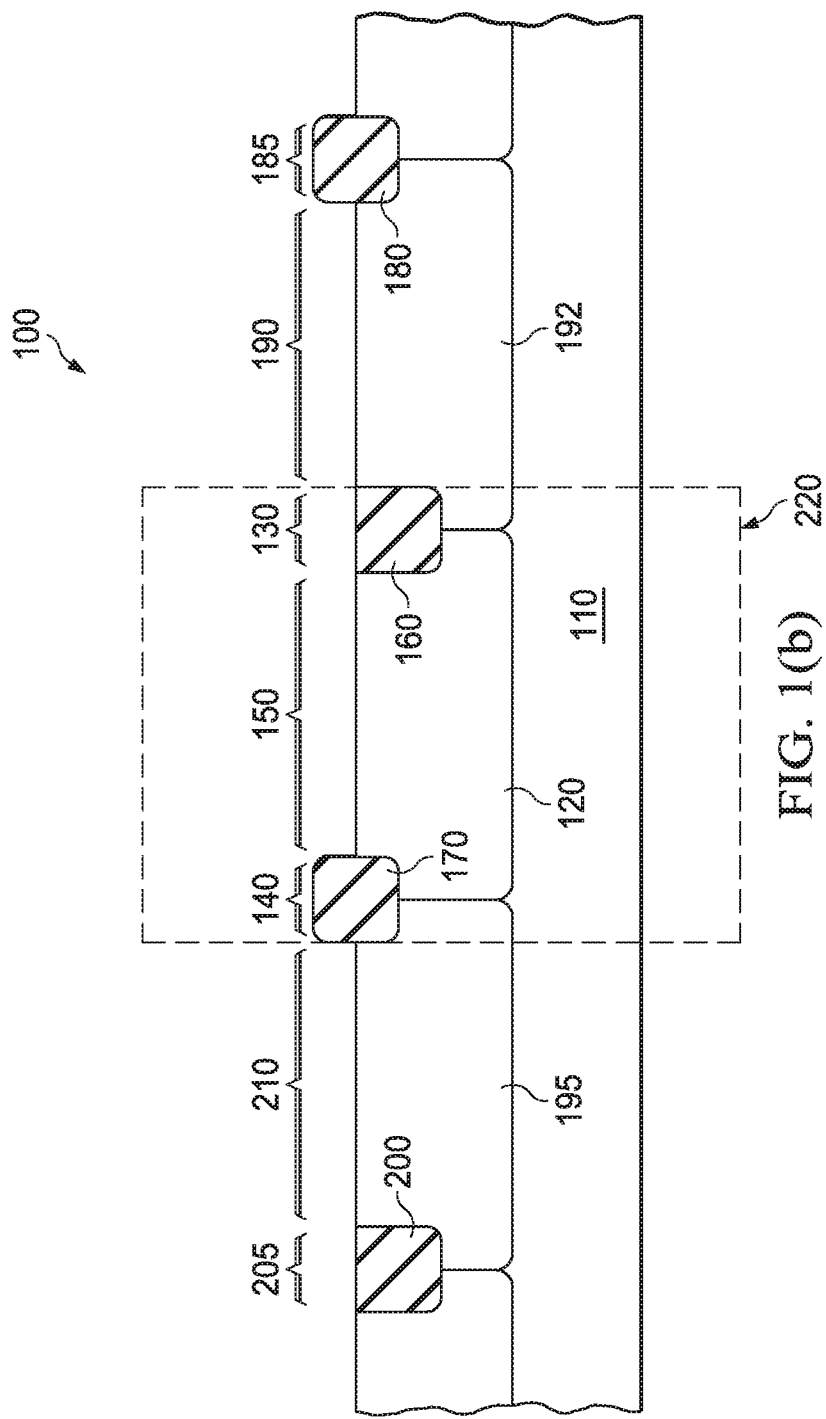
FIG. 1(b) is an illustrative cross-sectional side-view of a portion of the semiconductor wafer, in accordance with various examples.

FIG. 1(b) is a cross-sectional side-view of a portion 100 of a semiconductor wafer 90 that includes multiple isolation regions 130, 140, 185, and 205. The portion 100 also depicts multiple active regions 150, 190, 210, which share a substrate 110 that is common to the active regions 150, 190, 210. Each of the active regions 150, 190, 210 may include an electronic element (not shown) and these electronic elements should not interact with each other except through circuit interconnections. Therefore, isolation regions may be positioned such that the region between two isolation regions forms an active region. For instance, the active region 150 is between two isolation regions, i.e., isolation regions 130 and 140. Similarly, the active region 190 is between the isolation regions 130, 185, and the active region 210 is between the isolation regions 140 and 205. The portion 100 may also include multiple wells 120, 192, 195. The wells 120, 192, 195 may form a local substrate for the electronic elements in the active regions 150, 190, 210 (respectively).

The example depicted in FIG. 1(b) shows the active regions 210, 150, 190 being positioned such that the isolation regions 205, 140, 130, 185 surrounding each of the active regions 210, 150, 190 are fabricated using different techniques. For instance, the isolation regions 140, 130 may be formed using the LOCOS isolation technique and STI isolation technique, respectively. In such examples, the isolation regions 130, 185 may be formed using the STI technique and the LOCOS technique, respectively. Similarly, the isolation regions 205 and 140 may be formed using STI technique and the LOCOS technique, respectively. However, in other examples, the active regions 210, 150, 190 may positioned between isolation regions fabricated using similar fabrication techniques. For instance, the isolation regions 130, 140 may be fabricated using the STI technique. In other examples, the isolation regions 130, 140 may be fabricated using the LOCOS technique. Similar principles may apply for other isolation regions surrounding other active regions. The portion 100 further shows the dielectric layers 160, 170, 180, 200 that may be grown/deposited to form the isolation regions 130, 140, 185, 205 (respectively). In some examples, one or more of the dielectric layers 160, 170, 180, 200 may be formed using the dry-wet-dry oxidation technique.

Figure 1C:
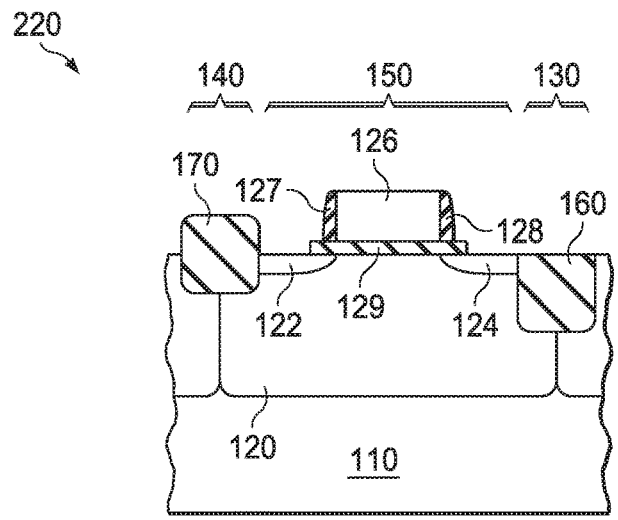
FIG. 1(c) depicts the cross-sectional view of a portion from FIG. 1(b), in accordance with various examples.

Refer now to FIG. 1(c), which depicts the cross-sectional view of the portion marked with the numeral 220 in FIG. 1(b). The portion 220 includes the isolation regions 130, 140, which includes dielectric layers 160, 170 respectively. The portion 220 also includes the active region 150 that is positioned between the isolation regions 130, 140. The portion 220 further depicts a portion of the substrate 110 and the local substrate 120. As noted above, the active region 150 may include an electronic element. An example of such an electronic element is depicted in FIG. 1(c). The electronic element includes a source region 122, a drain region 124, a gate layer 126, and first and second spacer regions 127, 128 (respectively). The electronic element also includes a gate oxide layer 129 on which the gate layer 126 is placed. In some examples, using dry-wet-dry oxidation technique improves the integrity of the oxide layer 129. In this example, the active region 150 includes a MOSFET. In other examples, the active region 150 may include other electronic elements (such as a bitcell) or other types of transistors (e.g., bipolar transistors, gallium nitride transistors). The description ahead assumes that the isolation regions 130, 140 may be fabricated using STI, LOCOS techniques, respectively. The isolation regions 130, 140 may include dielectric layers 160, 170 (respectively) that are grown and/or deposited to form the isolation regions 130, 140 using, at least in part, the dry-wet-dry oxidation technique.

Figure 2A:
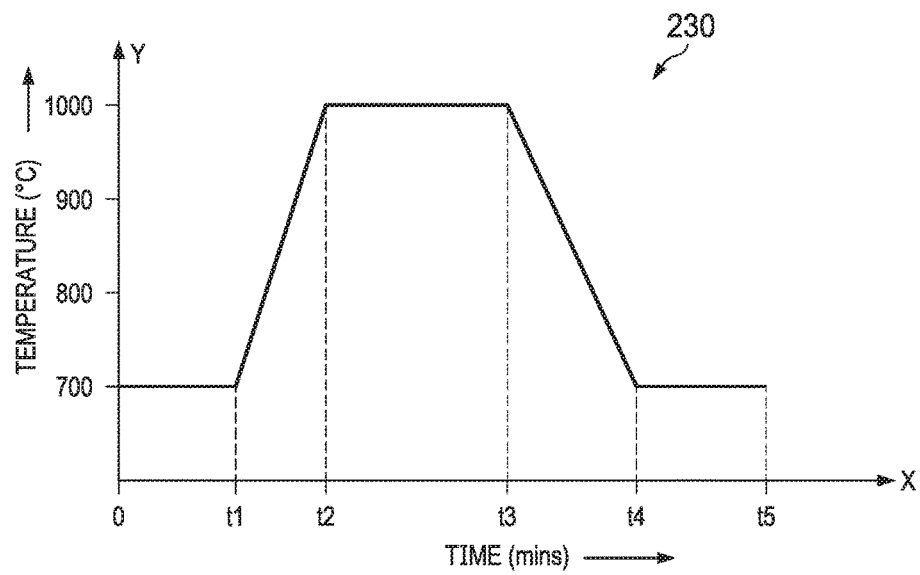
FIG. 2(a) depicts an illustrative timing diagram associated with the dry-wet-dry oxidation technique, in accordance with various examples.
Figure 2B:
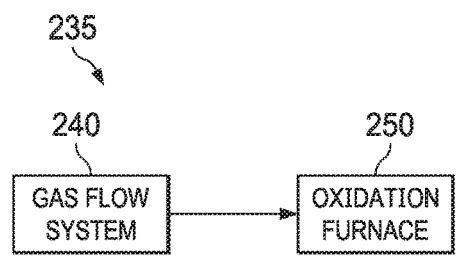
FIG. 2(b) depicts an illustrative block diagram depicting equipment used to perform the dry-wet-dry oxidation technique, in accordance with various examples.

Refer now to FIG. 2(a) and FIG. 2(b). FIG. 2(a) depicts an illustrative timing diagram 230 associated with the dry-wet-dry oxidation technique that may be used to grow a dielectric layer (e.g., dielectric layer 170) to form the isolation regions 130 and/or 140 (FIG. 1(b)). FIG. 2(b) depicts an illustrative block diagram 235 depicting equipment that may be used to perform the dry-wet-dry oxidation technique. The equipment may include a gas flow system 240, which may include gas cylinders that may supply gas (e.g., oxygen ($O_2$)), hydrogen (H), and nitrogen (N2) gases) at specific pressures to an oxidation furnace 250. The oxidation furnace 250, in turn, uses the gas supplied by the gas flow system 240 to perform the oxidation techniques described herein. The temperature and pressure inside the oxidation furnace 250 may be controlled by, e.g., a computer or a technician operating the oxidation furnace 250. The following description discloses dielectric layers 160, 170 that are grown and/or deposited to form the isolation regions 130, 140 in the portion 220. However, from a semiconductor industry practice perspective, the dielectric layers are grown/deposited on the complete wafer 90 (FIG. 1(a)) by placing it in the oxidation furnace 250. Therefore, the following description may be valid for a complete wafer, such as the wafer 90.

Referring back to FIG. 2(a), the X axis of the timing diagram 230 depicts time (in minutes) and the Y axis depicts temperature (in Celsius). The dry-wet-dry oxidation technique may use an oxidation furnace 250 (FIG. 2(b)) that may receive one or more gases and/or vapors from the gas flow system 240 (FIG. 2(b)) to grow/deposit the dielectric layer 160 and/or 170 to form the isolation regions 130, 140, respectively. The gas flow system 240 may provide gas to the oxidation furnace at different time intervals. FIG. 2(a) depicts the time intervals at which different gases may be provided to the oxidation furnace 250. Before initiating the dry-wet-dry oxidation process, in some examples, the oxidation furnace 250 is pre-heated to a desired temperature, such as 700 C. In some examples, during pre-heating, nitrogen gas may be supplied to the oxidation furnace through the gas flow system 240. Once the temperature is at the desired temperature, dry oxidation is performed from t0 to t1 by introducing oxygen gas in the oxidation furnace 250 through the gas flow system 240 and keeping the temperature of the oxidation furnace constant (e.g., 700 C). In some examples, the time interval t1 may depend on the desired thickness of the layer being formed. In some examples, the time interval t1 may be between 5-30 minutes. The dry oxidation process continues beyond t1, e.g., the oxygen gas is supplied into the oxidation furnace 250, but at an increasing temperature. In some examples, the temperature increases linearly (between t1 and t2) as shown. In other examples, the temperature may increase in a stepwise manner. When the temperature of the oxidation furnace 250 increases to 1000 C, the wet oxidation may begin. In some examples, the wet oxidation may occur between temperatures ranging 900 C-1100 C. This time instant is depicted in FIG. 2(b) at t2. In some examples, the time interval t2 may depend on the desired thickness of the oxidized layer.

From t2 to t3, the oxidation furnace performs wet oxidation. This is done by supplying hydrogen and oxygen gases simultaneously to the oxidation furnace 250. The oxidation furnace may be kept at a substantially constant temperature (e.g., 1000 C) during the wet oxidation process. In some examples, the wet oxidation process facilitates rounding of the corners of the regions in which oxidation takes place. The wet oxidation process may stop at t3, e.g., the hydrogen flow may be halted at t3. In some examples, the time t2 and t3 may depend on the desired thickness of the layer being formed. In some examples, the time interval t2 to t3 may be between 10-200 minutes. From t3 to t4, the dry oxidation process may begin, e.g., the oxygen gas flows from the gas flow system 240. Further, from t3 to t4, the temperature of the oxidation furnace 250 may be decreased. In some examples, the temperature decreases linearly as shown. In other examples, the temperature may decrease in a stepwise manner. The temperature of the oxidation furnace 250 stops decreasing when the temperature of the oxidation furnace drops to a defined temperature, such as 700 C. The dry oxidation process may still take place at the defined temperature for a time interval t4 to t5, during which the temperature may remain constant.

FIGS. 3(a)-3(g) are illustrative process flow diagrams depicting the fabrication of the isolation regions 130, 140 using the dry-wet-dry oxidation technique. Now, FIGS. 3(a)-3(g) are described in tandem with FIG. 4, which depicts a method 400 to grow the dielectric layers 160, 170 to form the isolation regions 130, 140 (respectively) using the dry-wet-dry oxidation technique. At least some of the steps (further disclosed in FIG. 4) that involve oxidation of the substrate 110 (i.e., growing/depositing the dielectric layers 160, 170) may be performed in the oxidation furnace 250. Other steps that involve etching, i.e., formation of the isolation regions 130, 140 may be performed away (e.g., in the etching station using the etching equipment) from the oxidation furnace 250. For simplicity's sake, it is assumed that the substrate 110 is a silicon substrate, but as noted above, the method 400 may be adapted for other kinds of substrates. The method 400 may begin with obtaining a substrate 110 comprising a first layer 310 and the second layer 300 (step 410, FIG. 3(a)). In some examples, the first layer may be a silicon dioxide layer that may be thermally grown on the silicon substrate 110 using the oxidation furnace 250. Forming the first layer 310 may or may not use the dry-wet-dry oxidation technique. In some examples, formation of the first layer 310 may be done prior to performing any manufacturing step on a wafer (such as wafer 90). This may be done to reduce the sensitivity of the wafer to trace contaminants that may be introduced to the wafers during the many manufacturing/fabrication steps that may be performed on the wafer to build circuits. In some examples, these initial pre-fabrication steps are called intrinsic gettering. The second layer 300 may be a layer of silicon nitride, which may further act as a mask during etching to form at least one of the isolation regions 130, 140. In some examples, the silicon nitride layer is formed by depositing a thin layer (e.g., 80 nm). The deposition may occur when reactants like NH3 and SiH4 are introduced in a furnace at a temperature of, e.g., 800 C. Both the first and the second layers 310, 300 may be deposited in the pre-fabrication steps.

Figure 3A:
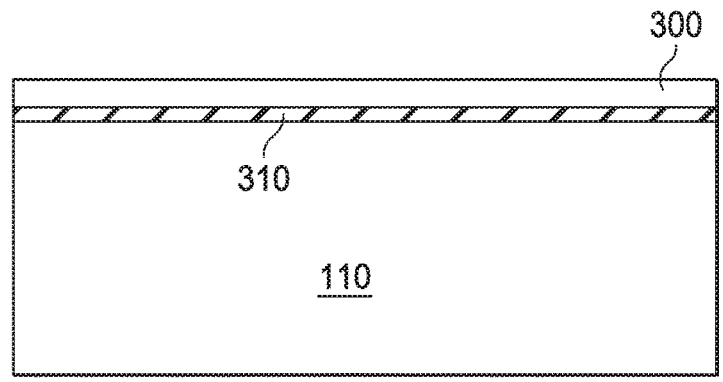
FIGS. 3(a)-3(g) are illustrative process flow diagrams depicting the fabrication of the isolation regions, in accordance with various examples.
Figure 3B:
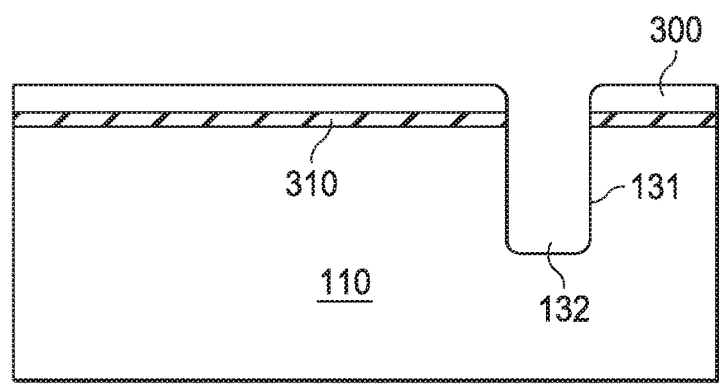
Figure 4:
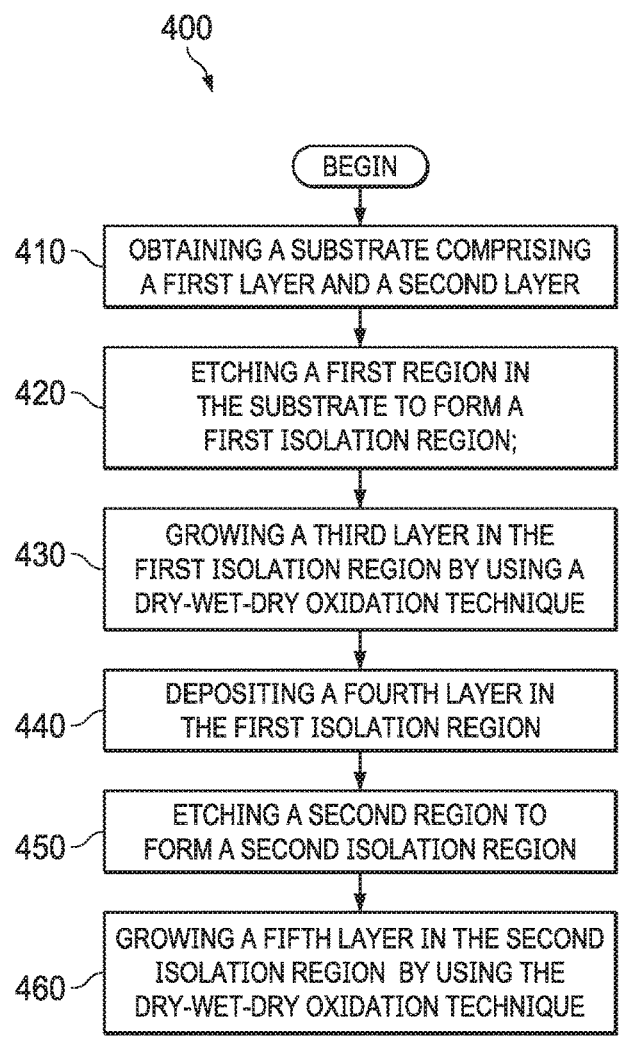
FIG. 4 is an illustrative method to grow dielectric layers in the isolation regions using the dry-wet-dry oxidation technique, in accordance with various examples.

The method 400 may next comprise etching a first region in the substrate 110 to form a trench 132 (step 420, FIG. 3(b)). As noted above, this etching step may be performed in an etching station that includes etching equipment. In some examples, prior to the step 420, there may be one or more steps that may be performed. For instance, a photoresist (not shown) may be deposited on the second layer 300. The photoresist may further go through a photolithography process (e.g., masking, patterning, etc.) to etch some portion in the first and second layers 310, 300 (not expressly shown) through which etching may be performed in the substrate 110 to form the trench 132. The trench 132 may include sidewalls 131. In some examples, this trench, after growing and depositing a dielectric layer, may form shallow trench isolation (STI) region. In some examples, dry and/or wet etching may be performed to form the isolation region 130.

Figure 3C:
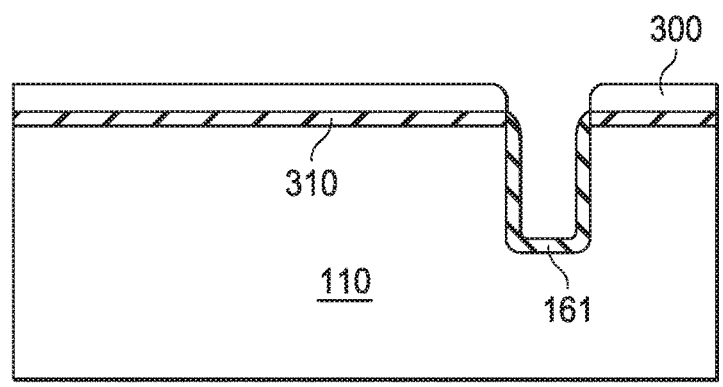

The method 400 may next comprise growing a third layer 161 in the first isolation region by using just dry oxidation. This may be performed in the oxidation furnace 250. In such an example, the third layer 161 may be grown at 900 C for 20-90 mins. The third layer 161 may be grown on the sidewalls 131 of the substrate 110. In some examples, the layer 161 may be grown using the dry-wet-dry oxidation technique (step 430, FIG. 3(c)). The step 430 is performed in the oxidation furnace 250. In some examples, the third layer 161 may form (or grow) on the sidewalls 131 of the substrate 110 in the isolation region 130. In some examples, the thickness of the third layer 161 may be in the range of 100-500 Angstrom. In some examples, the third layer 161 may extend from the sidewalls (or boundary) of the substrate 110 to the first layer 310, as depicted in FIG. 3(c). As noted above, it is assumed that the substrate 110 is silicon; therefore, the third layer 161 may be a silicon dioxide layer that is formed using the dry-wet-dry oxidation technique. Referring now to FIG. 2(a), to form the third layer 161, the time intervals may range from 20-90 mins (depending on the thickness.)

Figure 3D:
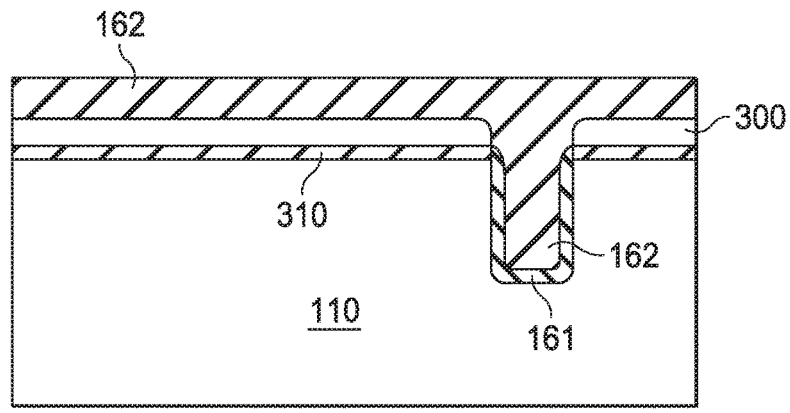
Figure 3E:
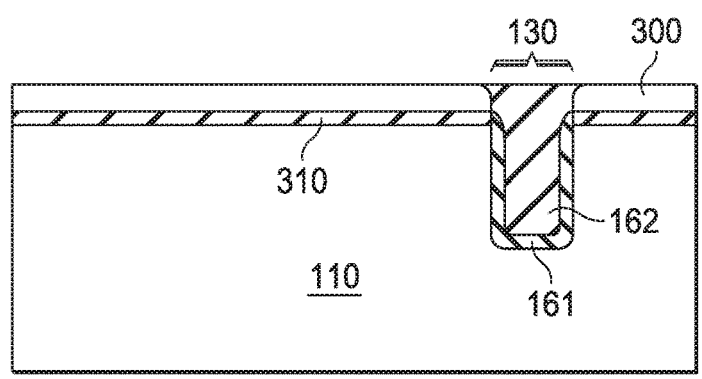
Figure 3F:
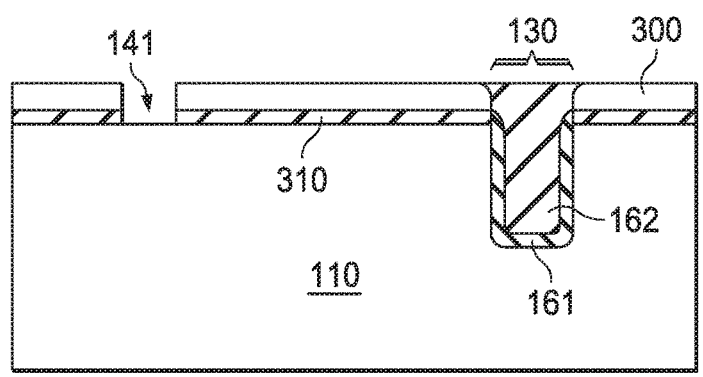
Figure 3G:
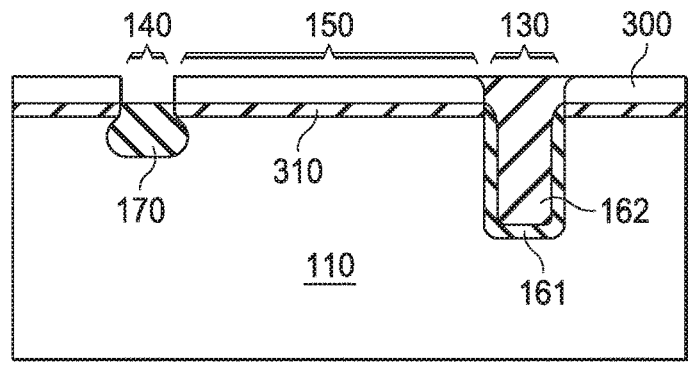

Until the step 430, the isolation region 130 includes the third layer 161. To completely fill the trench 132 with the silicon dioxide, a fourth layer 162 may be deposited in the isolation region 130 (step 440, FIG. 3(d)). In some examples, the fourth layer 162 may be a silicon dioxide layer deposited using chemical vapor deposition technique performed using chemical vapor deposition equipment. In some examples, sub-atmospheric chemical vapor deposition technique may be performed. In other examples, different deposition techniques may be used, such as high density plasma deposition. In some examples, the combination of the first and the second layers 161, 162 may be referred to as the dielectric layer 160. In some examples, following the deposition of the fourth layer 162, some portion of the fourth layer 162 may be deposited on the top of the second layer 300, as shown in FIG. 3(d). In such examples, a chemical mechanical polishing (CMP) technique (not expressly shown) may be used to remove the excess portion of the fourth layer 162. This CMP technique may be performed using CMP equipment. In some examples, CMP may be done such that the portion of the fourth layer 162 that was present on the top of the second layer 300 in FIG. 3(d) may be removed, as depicted in FIG. 3(e). FIG. 3(e) also depicts the first isolation region 130 including the third and fourth layers 161, 162.

The method 400 may next comprise etching a portion of the first and second layers 310, 300 to form a portion 141, which may initiate forming a second isolation region 140 (step 450, FIG. 3(*f*)). The portion 141 may be formed by using etching equipment. Stated another way, the step 450 etches away some portion of the first and second layers 310, 300 such that the step 450 exposes the portion 141 of the substrate 110. In some examples, prior to the step 450, there may be one or more steps that may be performed. For instance, a photoresist (not shown) may be deposited on the second layer 300. The photoresist may further go through a photolithography process (e.g., masking, patterning, etc.) to facilitate forming at least a portion of the second isolation region 140. In some examples, the dry and/or wet etching may be performed to form the dielectric layer present in the second isolation region 140.

In some examples, the portion 141 (after step 450) is locally oxidized to form a dielectric layer. In such examples, the method 400 may next comprise growing a fifth layer 170 by using the dry-wet-dry oxidation technique, which uses the oxidation furnace 250 (FIG. 2(*a*)) (step 460, FIG. 3(*g*)). Due to local oxidation of the substrate 110, the fifth layer 170 may form inside some portion of the substrate 110. In some examples, the fifth layer 170 may extend from the sidewalls of the substrate 110 to the first layer 310. As noted above, it is assumed that the substrate 110 is silicon; therefore, the fifth layer 170 may be a silicon oxide layer that is formed using the dry-wet-dry oxidation technique. Formation of the fifth layer 170 may result in the formation of the isolation region 140. Referring now to FIG. 2(*a*), to form the fifth layer 170, the time intervals may range from 10-200 mins. In some examples, the temperature at the time intervals may vary from 900-1100 C.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method comprising:
    etching a substrate to form a trench, wherein the trench includes sidewalls;
    forming a first isolation region in the trench by:
        growing a first layer of a first thickness on the sidewalls using a first dry-wet-dry oxidation technique comprising a first period of dry oxidation, a second period of wet oxidation, and a third period of dry oxidation; and
        depositing a second layer to fill a portion of the trench, the second layer contacting the first layer;
    etching third and fourth layers atop the substrate to expose a first portion of the substrate; and
    growing a second isolation region in the substrate through the first portion by using a second dry-wet-dry oxidation technique comprising a fourth period of dry oxidation, a fifth period of wet oxidation, and a sixth period of dry oxidation.

2. The method of claim 1, wherein the substrate comprises silicon.

3. The method of claim 2, wherein the first layer, the second layer, and the fourth layer comprise silicon dioxide, and wherein the third layer comprises silicon nitride.

4. The method of claim 1, wherein a region between the first isolation region and the second isolation region is an active region, and wherein an electronic element is positioned in the active region.

5. The method of claim 1, wherein an active region is positioned between the first isolation region and the second isolation region.

6. The method of claim 5, wherein an electronic element is positioned in the active region.

7. The method of claim 1, wherein the first layer, the second layer comprise silicon dioxide, and the third layer comprises silicon nitride.

8. The method of claim 1, wherein the first isolation region is a shallow trench insulation (STI) region.

9. The method of claim 1, wherein the second isolation region is a local oxidation of silicon (LOCOS) isolation region.

10. The method of claim 1, wherein the first and fourth periods of dry oxidation comprise heating the substrate at 700° C. in an oxygen atmosphere, said second and fifth periods of wet oxidation comprise heating the substrate at 1000° C. in a hydrogen/oxygen atmosphere, and the third and sixth periods of dry oxidation comprise heating the substrate at 700° C. in an oxygen atmosphere.

11. A method comprising:
    forming a first dielectric layer having a first thickness on a sidewall of a trench within a semiconductor substrate, the forming including using a first dry-wet-dry oxidation process comprising a first period of dry oxidation, a second period of wet oxidation, and a third period of dry oxidation; and
    depositing a dielectric fill into the trench;
    removing a portion of a second dielectric layer located over the substrate thereby exposing a portion of the substrate; and
    oxidizing the exposed portion of the substrate using a second dry-wet-dry oxidation process.

12. The method of claim 11, wherein each of the first and second the dry-wet-dry oxidation processes include:
    heating the substrate at a first temperature in the presence of oxygen for a first time period;
    increasing the temperature of the substrate to a second temperature in the presence of oxygen during a second time period;
    heating the substrate at the second temperature in an atmosphere in the presence of hydrogen for a third time period; and
    decreasing the temperature of the substrate in the presence of oxygen during a fourth time period.

13. The method of claim 12, wherein the first and second dry-wet-dry oxidation processes are a same process.

14. The method of claim 13, wherein the first temperature is about 700° C. and the second temperature is about 1000° C.

15. The method of claim 12, wherein the temperature is increased about linearly over the second time period.

16. The method of claim 12, wherein the temperature is decreased about linearly over the fourth time period until the temperature reaches the first temperature.

17. The method of claim 11, wherein the second dielectric layer comprises silicon and nitrogen.

* * * * *